US011156920B2

(12) United States Patent
Yamamoto et al.

(10) Patent No.: US 11,156,920 B2
(45) Date of Patent: Oct. 26, 2021

(54) LITHOGRAPHY COMPOSITION, A METHOD FOR FORMING RESIST PATTERNS AND A METHOD FOR MAKING SEMICONDUCTOR DEVICES

(71) Applicant: Ridgefield Acquisition, Luxembourg (LU)

(72) Inventors: Kazuma Yamamoto, Kakegawa (JP); Maki Ishii, Kakegawa (JP); Tomoyasu Yashima, Kakegawa (JP); Tatsuro Nagahara, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 5 days.

(21) Appl. No.: 16/462,972

(22) PCT Filed: Nov. 21, 2017

(86) PCT No.: PCT/EP2017/079858
§ 371 (c)(1),
(2) Date: May 22, 2019

(87) PCT Pub. No.: WO2018/095885
PCT Pub. Date: May 31, 2018

(65) Prior Publication Data
US 2019/0377263 A1 Dec. 12, 2019

(30) Foreign Application Priority Data

Nov. 25, 2016 (EP) .................... 16002517

(51) Int. Cl.
*G03F 7/40* (2006.01)
*H01L 21/027* (2006.01)
*G03F 7/16* (2006.01)
*G03F 7/20* (2006.01)
*G03F 7/32* (2006.01)
*G03F 7/38* (2006.01)

(52) U.S. Cl.
CPC ............ *G03F 7/40* (2013.01); *H01L 21/0274* (2013.01); *G03F 7/162* (2013.01); *G03F 7/168* (2013.01); *G03F 7/2004* (2013.01); *G03F 7/322* (2013.01); *G03F 7/38* (2013.01)

(58) Field of Classification Search
CPC ... G03F 7/40; G03F 7/322; G03F 7/26; G03F 7/42
See application file for complete search history.

(56) References Cited

U.S. PATENT DOCUMENTS

| 2004/0029395 | A1 | 2/2004 | Zhang et al. |
| 2008/0051308 | A1* | 2/2008 | Kane ............... G03F 7/425 510/176 |
| 2014/0057437 | A1 | 2/2014 | Kozawa et al. |
| 2015/0331319 | A1 | 11/2015 | Yokoyama et al. |
| 2016/0109805 | A1 | 4/2016 | Matsuura et al. |

FOREIGN PATENT DOCUMENTS

| EP | 1757989 A1 | 2/2007 |
| EP | 2605069 A1 | 6/2013 |
| JP | 2012211949 A | 11/2012 |
| JP | 201444298 A | 3/2014 |
| JP | 2014219577 A | 11/2014 |

OTHER PUBLICATIONS

International Search Report for PCT/EP2017/079858 dated Feb. 5, 2018.
Namatsu, H., et al., "Dimensional limitations of silicon nanolines resulting from pattern distortion due to surface tension of rinse water", Applied Physics Letters, vol. 66. No. 20, (1995), pp. 2655-2657.
Written Opinion of the International Searching Authority for PCT/EP2017/079858 dated Feb. 5, 2018.

\* cited by examiner

*Primary Examiner* — Daborah Chacko-Davis
(74) *Attorney, Agent, or Firm* — Faegre Drinker Biddle & Reath LLP

(57) ABSTRACT

The present invention relates to a new lithography composition, the forming of resist patterns using the lithography composition, and a semiconductor device manufacturing method using the lithography composition in a photolithography method.

11 Claims, 1 Drawing Sheet

LITHOGRAPHY COMPOSITION, A METHOD FOR FORMING RESIST PATTERNS AND A METHOD FOR MAKING SEMICONDUCTOR DEVICES

CROSS-REFERENCE TO RELATED APPLICATIONS

This application is a national stage application (under 35 U.S.C. § 371) of PCT/EP2017/079858, filed Nov. 21, 2017, which claims benefit of European Application No. 16002517.7, filed Nov. 25, 2016, both of which are incorporated herein by reference in their entirety.

TECHNICAL FIELD

The present invention relates to a lithography composition and a method for forming a photoresist pattern using the lithography composition. One embodiment of the present invention relates to a lithography composition which can be used in a rinse process after development of a photosensitive resin composition applied for manufacturing of a semiconductor device, a flat panel display (FPD) such as a liquid crystal display element, a color filter and so on and to a method for forming a photoresist pattern. Another embodiment of the present invention relates to a semiconductor manufacturing method that includes a resist pattern rinse process using the lithography composition.

BACKGROUND

In various fields such as manufacturing of semiconductor integrated circuits for example a Large Scale Integration (LSI), display faces of flat panel displays (FPDs), circuit substrates, color filters, and so on, photolithography technology has so far been employed for conducting fine processing. In the photolithography technology, a positive- or negative-working photosensitive resin composition (photoresist composition) is used for forming a resist pattern.

Along with smaller devices having more processing capacity, finer patterns in integrated circuits are required. Such fineness requires further improved properties for example, high wettability, less residue after eliminating process, decreasing lithography light reflex, shrinking trench width of exposed photoresist patterns, and so on. It also requires water based lithography compositions to have a solubility and dispensability of solvent (e.g., lithography materials) and easiness to remove them in a subsequent process step.

Due to the high surface tension, pure water washing and drying can cause resist pattern collapse. One approach to prevent pattern collapse is to research a rinse composition with a low surface tension. But, in addition to the surface tension, the resist pattern shape, especially pitch width influences the stress to the resist pattern. As described in "Dimensional limitations of silicon nanolines resulting from pattern distortion due to surface tension of rinse water" Namatsu et al. Appl. Phys. Lett. 1995 (66) p 2655-2657, a short distance between pattern walls will cause the stress to increase. And a narrow pattern wall width will cause the stress to increase, too.

Patent publication JP2014-219577A discloses a rinse composition having a nonionic surfactant with a good efficiency for melting. Patent publication JP2014-44298A discloses a rinse composition having a linear alkane diol to prevent resist pattern collapse by rinsing.

SUMMARY OF THE INVENTION

Problems to be Solved by the Invention

For finer patterns, high wettability and less residue after eliminating process (drying, etching, dissolving and so on) are important for inhibiting defects. In that process, more fine patterns would be exposed to more severe stress by rinse dry, and, accordingly, further developments for lithography composition suitable for fine patterns are required. Our inventors found a water-based lithography composition described in this specification that exhibits good performance for narrow pitched resist pattern rinsing, for example, pitches in the patterns that are narrower than 20 nm. After resist pattern rinsing with above lithography composition and drying it, pattern collapse can be prevented and pattern defects are reduced. The present invention also provides a method to form resist patterns, and a method to manufacture semiconductor devices.

DEFINITIONS

Figure 1:
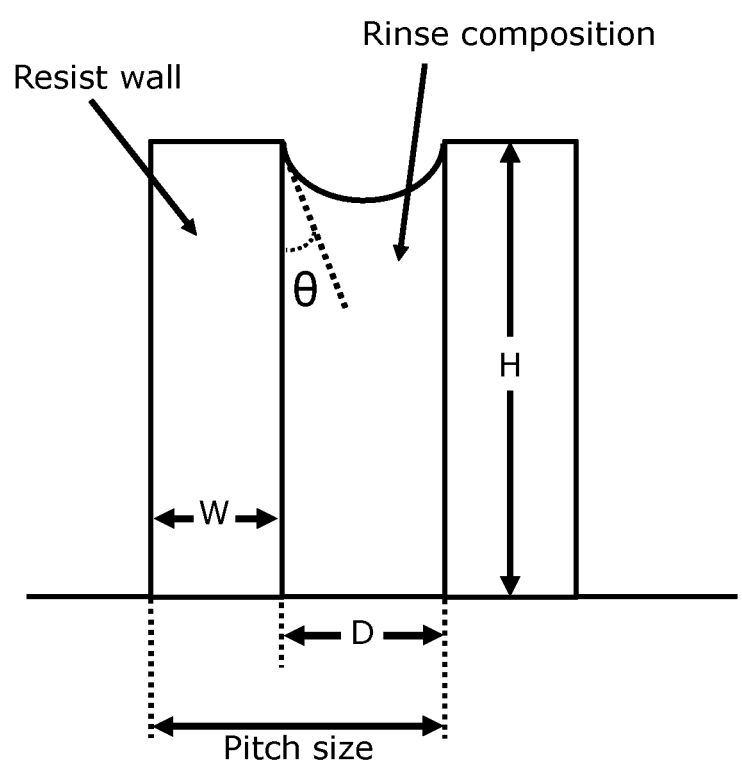
FIG. 1 is an exemplary schematic illustration of resist walls during rinsing.

Unless otherwise stated, the following terms used in the specification and claims shall have the following meanings for the purpose of this Application.

In this application, the use of the singular includes the plural, and the words "a", "an" and "the" mean "at least one", unless specifically stated otherwise. Furthermore, the use of the term "including", as well as other forms such as "includes" and "included", is not limiting. Also, terms such as "element" or "component" encompass both elements or components comprising one unit and elements or components that comprise more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measureable numerical variable, refers to the indicated value of the variable and to all values of the variable that are within the experimental error of the indicated value (e.g., within the 95% confidence limit for the mean) or within ±10 percent of the indicated value, whichever is greater.

As used herein, "$C_{x-y}$", "$C_x$-$C_y$" and "$C_x$" designate the number of carbon atoms in a molecule. For example, $C_{1-6}$ alkyl chain refers to an alkyl chain having a chain of between 1 and 6 carbons (e.g., methyl, ethyl, propyl, butyl, pentyl and hexyl).

In the case of numerical range is described with "-" or "~", these include end points and units are common. For example, 5-25 mol. % refers to equal to or more than 5 molecular % and equal to or less than 25 molecular %.

In this specification in the case polymer comprises plural kinds of repeating units without any specific definitions, these repeating units copolymerize each other. These copolymerization can take alternating copolymerization, random copolymerization, block copolymerization, graft copolymerization, or mixture of thereof.

In this specification, without any descriptions, temperature unit is Celsius. For example, 25 degree in temperature refers to 25 degree Celsius.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Means for Solving the Problems

A lithography composition of present invention comprises:
a lithography material, water and a surfactant represented by below formula (I),

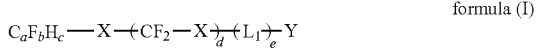

formula (I)

wherein a is 1, 2, 3, 4 or 5,
b and c are integer, b+c=2a+1, b is on or more than 1,
d is 0, 1 or 2,
e is 0 or 1,
each X is independently represented by below formula (II), —O—CFR$_1$—  formula (II), R$_1$ is —F, —CF$_3$, —CF$_2$H, —CFH$_2$ or —CH$_3$,
Y is —COOH, —SOWN or an amide group represented by below formula (III),

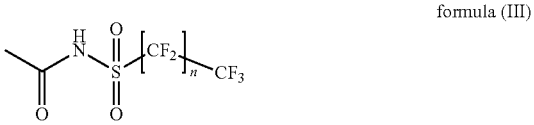

formula (III)

n is 0, 1 or 2,
L$_1$ is represented by below formula (IV),

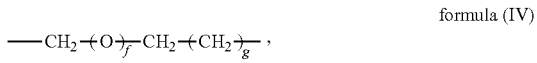

formula (IV)

f is 0 or 1, and
g is 0, 1, 2 or 3.

And as a lithography composition of present invention, one embodiment of the lithography material is a diol derivative represented by below formula (V),

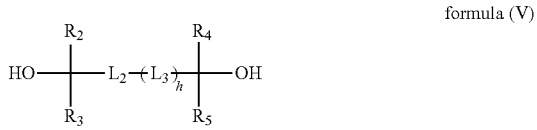

formula (V)

wherein R$_2$, R$_3$, R$_4$ and R$_5$ are independently hydrogen, fluorine or C$_{1-5}$ alkyl, L$_2$ and L$_3$ are independently unsubstituted or substituted C$_{1-5}$ alkane linker, unsubstituted or substituted C$_{2-4}$ alkene linker, or unsubstituted or substituted C$_{2-4}$ alkyne linker,
when C$_{1-5}$ alkane linker, C$_{2-4}$ alkene linker or C$_{2-4}$ alkyne linker are substituted, each substituent is independently fluorine, C$_{1-5}$ alkyl, or hydroxyl, and
h is 0, 1 or 2.

And a lithography composition of present invention optionally further comprises at least one additional component selected from acids, bases, surfactants other than the surfactant represented by formula (I) and an organic solvent other than the diol derivative represented by formula (V.

And a lithography composition of present invention optionally further comprises at least one additional component selected from fungicides, antimicrobial agents, preservatives and antifungal agents.

A method for forming resist patterns of the present invention comprises applying the lithography composition thereof to a substrate.

A lithography method for forming resist patterns of the present invention, comprises:
(1) applying a photosensitive resin composition on a substrate, with or without one or more intervening layers, to make a photosensitive resin composition layer,
(2) exposing the photosensitive resin composition layer to radiation,
(3) developing the exposed photosensitive resin composition layer, and
(4) rinsing the developed layer with the lithography composition.
The developed layer here means resist patterns before rinsed.

A semiconductor device manufacturing method of the present invention comprises the method of forming resist patterns.

A semiconductor device manufacturing method of present invention further comprises making gaps in the substrate by using the formed resist patterns as a mask.

Effects of the Invention

Defects are reduced by using a present invention lithography composition. And a present invention lithography composition exhibits good performance for narrow pitched resist pattern rinsing, and can prevent pattern collapse and pattern defects. By using this invention lithography composition and method using thereof, the efficiency is improved to form resist patterns on the integrated circuit devices (as like semiconductors) and manufacturing them.

DETAILED DESCRIPTION OF THE INVENTION

It is to be understood that both the foregoing general description and the following detailed description are illustrative and explanatory, and are not restrictive of the subject matter, as claimed.

<Lithography Composition>

Our invention provides new lithography composition which comprises:
a lithography material, water and a surfactant represented by below formula (I),

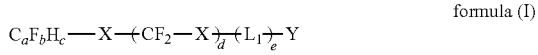

formula (I)

wherein a is 1, 2, 3, 4 or 5,
b and c are integer, b+c=2a+1, b is on or more than 1,
d is 0, 1 or 2,
e is 0 or 1,
each X is independently represented by below formula (II), $$-O-CFR_1- \quad \text{formula (II),}$$

$R_1$ is —F, —$CF_3$, —$CF_2H$, —$CFH_2$ or —$CH_3$,
Y is —COOH, —$SO_3H$ or an amide group represented by below formula (III), formula (III)

n is 0, 1 or 2,
$L_1$ is represented by below formula (IV), $$-CH_2+O+_f-CH_2+CH_2+_g-, \quad \text{formula (IV)}$$

f is 0 or 1, and
g is 0, 1, 2 or 3.
In this specification C (large C), F, O and H in chemical formula each means Carbon, Fluorine, Oxygen and Hydrogen atoms.

<Surfactant>
The surfactant comprised by our invention lithography composition is described below.

$$C_aF_bH_c-X+CF_2-X+_d+L_1+_e-Y \quad \text{formula (I)}$$

a is 1, 2, 3, 4 or 5. Preferably a is 1, 3 or 4.
b and c are integer, b+c=2a+1, and b is one or more than 1. Preferably c=0 and b=2a+1.
d is 0, 1 or 2. Preferably d is 1 or 2. When d is not 0, the more than one X in the formula (I) is same or different from each other, preferably same.
e is 0 or 1. Preferably e is 0 when Y is —COOH or an amide group represented by below formula (III). Preferably e is 1 when Y is —$SO_3H$.
Each X is independently represented by below formula (II), —O—$CFR_1$— formula (II). When more than one X is present in the above surfactant, all X are preferably identical to each other.
$R_1$ is —F, —$CF_3$, —$CF_2H$, —$CFH_2$ or —$CH_3$. Preferably $R_1$ is —F or —$CF_3$.
Y is —COOH, —$SO_3H$ or an amide group represented by below formula (III), formula (III)

n is 0, 1 or 2. n is preferably 0 or 1.
$L_1$ is represented by below formula (IV), $$-CH_2+O+_f-CH_2+CH_2+_g-. \quad \text{formula (IV)}$$

f is 0 or 1. Preferably f is 1.
g is 0, 1, 2 or 3. Preferably g is 1 or 2, more preferably g is 2.
For example, the below compound is read as a=3, b=7 (2a+1), c=0, d=1, $R_1$ is —$CF_3$ in both 2 Xs, e=1, f=1, g=2, and Y is —$SO_3H$.

The present invention lithography composition can comprise 2 or more surfactants different from each other, which are each represented by formula (I). For example, surfactants combination of Perfluoro-3,6-dioxadecanoic acid and Perfluoro-3,6,9-trioxadecanoic acid is applicable for this invention.

Surfactants comprised by our inventive lithography composition include, but are not limited to, the following:

-continued

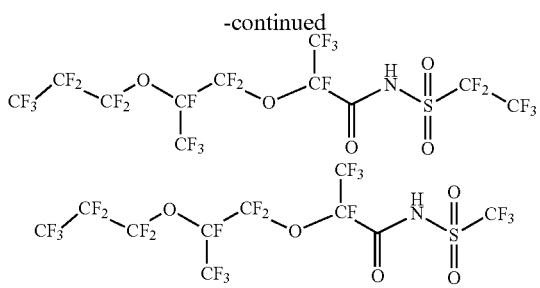

Surfactants comprised by our invention can be obtained from Unimatec Co. Ltd., fluorochem, or by the synthesis described in the following examples.

One embodiment effect by the surfactant in the present invention lithography composition is contributing to reduce and/or prevent pattern collapse after resist patterns are rinsed and dried. Without being bound by theory, one reason for the above effect is that the low affinity between the present invention surfactant and the resist wall can increase the contact angle of the lithography composition in the rinse drying process. The fluorine in the formula (I) can decrease the surface tension of the composition. Y (polar group) in the formula (I) can make the surfactant soluble. If the acidity of Y is strong, it will increase the surface tension of the composition. Less acidity of Y as polar group can take a good balance between solubility and low surface tension.

Relative to the total mass of the lithography composition, ratio of the above surfactant(s) of this lithography composition is preferably 0.01~0.5 mass %, more preferably 0.01~0.2 mass %, further preferably 0.02~0.1 mass %, further more preferably 0.02~0.05 mass %. This surfactant exhibits good wettability and clean residues, even in with low amount.

Inventors found methods to synthesize the novel compound of the following formula (I'). The definitions of below a, b, c, d, e, f, g, X, Y, n, $R_1$ and $L_1$ in formula (I)' including formula (II)', (III)' and (IV)' are the same as above definitions in formula (I) including formula (II), (III) and (IV). The exemplified compounds and descriptions in formula (I)' are same corresponding to formula (I) with exception that Y in formula (I)' doesn't include —COOH.

A compound represented by following formula (I)',

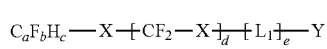
formula (I)' wherein a is 1, 2, 3, 4 or 5,
b and c are integer, b+c=2a+1, b is on or more than 1,
d is 0, 1 or 2,
e is 0 or 1,
each X is independently represented by below formula (II)', —O—$CFR_1$—  formula (II)', $R_1$ is —F, —$CF_3$, —$CF_2H$, —$CFH_2$ or —$CH_3$,
Y is —SOWN or an amide group represented by below formula (III)',

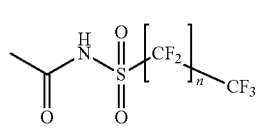
formula (III)' n is 0, 1 or 2,
$L_1$ is represented by below formula (IV)',

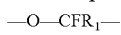
formula (IV)' f is 0 or 1, and
g is 0, 1, 2 or 3.

Our invention also provides novel surfactant(s) comprising above novel compound(s) represented by above formula (I)'. Our invention further provides novel lithography surfactant(s) comprising above novel compound(s) represented by above formula (I)'.

<Lithography Material>

In this invention lithography composition, lithography material is a solute in water solvent. This lithography material can be eliminated in later elimination process (drying, etching, deposition and so on). As one embodiment of this invention, a lithography composition can be a top anti reflective coating (TARC) composition which will be layered over photoresist layer to inhibit reflex lithography light. As a TARC composition, a fluorine derivative polymer is an example of lithography materials which will be used with the above surfactant(s). As another embodiment of this invention, a lithography composition can be a fine patterning composition. As a fine pattering composition, a vinyl resin polymer and an amine derivative are examples of lithography materials which may be used with the above surfactant(s). As another embodiment of this invention, a lithography composition can be a substrate cleaning composition. As a substrate cleaning composition, acid, alkali and hydrogen peroxide are examples of lithography materials which will be used with the above surfactant(s).

As another embodiment of this invention, a lithography composition can be a rinse composition used for rinsing exposed and developed resist patterns. As a rinse composition, diol derivative(s) described below are examples of lithography materials which may be used with the above surfactant. In other words, an invention lithography composition is preferably a rinse composition, a top anti-reflective coating composition, a fine patterning composition, or a substrate cleaning composition. Further preferably it is a rinse composition.

<Diol Derivative>

The diol derivative as lithography material of our invention is described below.

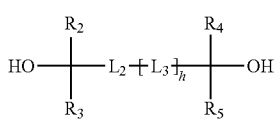
formula (V)

$R_2$, $R_3$, $R_4$ and $R_5$ are independently hydrogen, fluorine or $C_{1-5}$ alkyl. Preferably, $R_2$, $R_3$, $R_4$ and $R_5$ are independently hydrogen, fluorine, methyl, ethyl, t-butyl or isopropyl. More preferably, $R_2$, $R_3$, $R_4$ and $R_5$ are independently hydrogen, methyl or ethyl. Further preferably $R_2$, $R_3$, $R_4$ and $R_5$ are independently methyl or ethyl.

$L_2$ and $L_3$ are independently unsubstituted or substituted $C_{1-5}$ alkane linker, unsubstituted or substituted $C_{2-4}$ alkene linker, or unsubstituted or substituted $C_{2-4}$ alkyne linker. $L_2$ and $L_3$ are independently unsubstituted or substituted $C_{1-5}$ alkane linker, unsubstituted or substituted $C_{2-4}$ alkene linker or unsubstituted or substituted $C_{2-4}$ alkyne linker. Preferable alkane linker is $C_2$ or $C_4$. Preferable alkene linker is $C_2$. Preferable alkyne linker is $C_2$.

When $C_{1-5}$ alkane linker, $C_{2-4}$ alkene linker or $C_{2-4}$ alkyne linker of $L_2$ or $L_3$ are substituted, each substituent is independently fluorine, $C_{1-5}$ alkyl, or hydroxyl. $C_{1-5}$ alkyl as the substituent is preferably methyl, ethyl, t-butyl or isopropyl. Preferably $C_{1-5}$ alkane linker, $C_{2-4}$ alkene linker or $C_{2-4}$ alkyne are unsubstituted, or substituted by fluorine. More preferably, $C_{1-5}$ alkane linker, $C_{2-4}$ alkene linker or $C_{2-4}$ alkyne are unsubstituted.

h is 0, 1 or 2, preferably h is 0 or 1, more preferably h is 0. When formula (V) means 2,4-Hexadiyne-1,6-diol, it can be read as h=1, $L_2$ and $L_3$ are acetylene linker ($C_2$ alkyne linker). When formula (V) means 2,2,3,3-Tetrafluoro-1,4-butanediol, it can be read as h=0, $L_2$ is a fluoroethylene linker ($C_2$ alkane linker, substituted by fluorines).

A diol derivative which has $C_{2-16}$ is preferable.

The present invention lithography composition can comprise 2 or more diol derivatives different from each other, who are each represented by formula (V). For example, diol derivatives combination of 3-Hexyn-2,5-diol and 2,5-Dimethyl-3-hexyne-2,5-diol is applicable for this invention. Exemplified examples of the diol derivative comprised by our invention lithography composition are 3-Hexyn-2,5-diol, 2,5-Dimethyl-3-hexyne-2,5-diol, 3,6-Dimethyl-4-octyne-3,6-diol, 1,4-Butynediol, 2,4-Hexadiyne-1,6-diol, 1,4-Butanediol, 2,2,3,3-Tetrafluoro-1,4-butanediol, 2,2,3,3,4,4,5,5-Octafluoro-1,6-hexanediol, cis-1,4-Dihydroxy-2-butene, and any mixture of any of these.

The diol derivative in the present invention lithography composition can contribute to reduce defects of the resist patterns after rinsing and drying them. Comparing to small molecule which has 1 hydroxyl for example ethanol, the diol derivative can prevent immigrations into resist walls which could cause resist pattern melting.

Relative to the total mass of the lithography composition, ratio of the above diol derivative(s) of this lithography composition is preferably 0.01~0.5 mass %, more preferably 0.02~0.2 mass %, further preferably 0.03~0.1 mass %.

The diol derivative as solute has good solubility for water. So, the diol derivative can be eliminated with water by elimination process (e.g., spin dry).

<Water>

The water of the present invention lithography composition is a solvent for this composition, preferably pure water or deionized water. As a liquid component the water constitutes major solvent though this lithography composition can comprise other liquid components.

Relative to the total mass of the lithography composition, ratio of the above water of this lithography composition is preferably 80.00~99.98 mass %, more preferably 90.00~99.98 mass %, further preferably 95.00~99.98 mass %.

<Other Components>

The present invention lithography composition may further comprise additives, for example an acid, a base, an organic solvent, other water-soluble compounds or mixtures thereof.

The acid or base can be used for adjusting a pH value of a process liquid or improving solubility of additive components. Carboxylic acids, amines, and ammonium compounds are examples of the acid and base. These include fatty acids, aromatic carboxylic acids, primary amines, secondary amines, tertiary amines, and ammonium compounds and these compounds can be non-substituted or substituted by substituent(s). More specifically, the acid or base can be formic acid, acetic acid, propionic acid, benzoic acid, phthalic acid, salicylic acid, lactic acid, malic acid, citric acid, oxalic acid, malonic acid, succinic acid, fumalic acid, maleic acid, aconitic acid, glutaric acid, adipic acid, monoethanol amine, diethanolamine, triethanolamine, triisopropanolamine, ethylenediamine, diethylenetriamine, pentaethylenehexamine, piperizine, piperazine, morpholine, tetramethylammonium hydroxide, and combinations thereof. The preferable amount of the acid added is 0.005~0.1% by mass (50~1,000 ppm), relative to the total amount of the lithography composition. The preferable amount of the base added is 0.01~0.3% by mass (100~3,000 ppm), relative to the total amount of the lithography composition.

In the lithography composition of the present invention, optional organic solvents other than water can be used as a co-solvent. The organic solvents have a function adjusting a surface tension of the lithography composition and can improve wettability to a surface of the resist. For the purpose above, water soluble organic solvents are preferable, for examples alcohols such as methyl alcohol, ethyl alcohol, isopropyl alcohol, and t-butyl alcohol; glycols such as ethylene glycol and diethylene glycol; ketones such as acetone and methyl ethyl ketone; esters such as methyl acetate, ethyl acetate, and ethyl lactate; dimethylformamide, dimethylacetamide, dimethylsulfoxide, methyl cellosolve, cellosolve, butyl cellosolve, cellosolve acetate, alkyl cellosolve acetate, propylene glycol alkyl ether, propylene glycol alkyl ether acetate, butyl carbitol, carbitol acetate, and tetrahydrofuran.

Preferable ratio of the organic solvent is on or less than 5% by mass relative to the total mass of the lithography composition, more preferably on or less than 1% by mass, further preferably 0.01~0.3% by mass (100~3,000 ppm). Too much organic solvent in the lithography composition can dissolve or denature resist patterns. 0% of the organic solvent is also one embodiment of the present invention lithography composition.

As to the other water-soluble compounds, they can also be used for improving the dissolution of additive components. For example, other surfactant (different from surfactants represented by above formula (I)) are the examples. These other surfactants can be nonionic surfactants, cationic surfactants, anionic surfactants, or amphoteric surfactants. Of these, nonionic surfactants are preferred. For examples, ADEKA® Pluronic manufactured by ADEKA CORPORATION is candidates for this invention lithography composition. The amount of these other surfactants is preferably 0.01~0.3% by mass (100~3,000 ppm) relative to the total mass of the lithography composition.

The present invention lithography composition can optionally comprise an antimicrobial, an antibacterial, an antiseptic, and/or a fungicide. These chemicals are used for preventing bacteria and fungi from propagating in an elapsed lithography composition. Examples of these chemicals are alcohols such as phenoxyethanol and isothiazolone. Bestcide (NIPPON SODA CO., LTD.) is a particularly effective antimicrobial, antibacterial, and fungicide. The amount of these chemicals in the present lithography composition is preferably 0.0001~1% by mass (1~10,000 ppm), more preferably 0.001%~0.1% by mass (10~1,000 ppm), with mass % and ppm relative to the total of the lithography composition.

The lithography composition of the present invention can be filtered with a filter to remove impurities and/or insolubles after components of the lithography composition are dissolved.

<A Method for Forming Resist Patterns>

A method for forming resist patterns according to the present invention are explained below. A lithography step in the pattern forming method of the present invention can be any method wherein resist patterns are formed using known positive-working or negative-working photosensitive resin composition which can be developed with an alkali aqueous solution. As used herein, when the resin composition is described as being applied to a substrate, the resin composition can be applied directly onto the substrate or with one or more other layers being applied between the substrate and the resin composition layer. One method is exemplified as below.

First, a substrate can be cleaned for removing dust or residues by a substrate cleaning composition. A photosensitive resin composition is applied onto a surface of a substrate such as a silicon wafer or a glass plate, which is preprocessed if necessary, with a known coating method to form a photosensitive resin composition layer. A bottom anti-reflection coating film as an intervening layer can be formed on the substrate and later coated by the photosensitive resin composition layer. The photosensitive resin composition layer can be coated by anti-reflection film which is made from a top anti-reflective coating composition. One embodiment of this invention lithography composition is used as a top anti-reflective coating composition to make a top anti-reflection film over photoresist layer. The cross-sectional shape of the resist patterns and the exposure margin of the photosensitive resin composition can be improved by forming the anti-reflection film as an upper or lower layer of the photosensitive resist composition layer.

Typical examples of the known positive-working or negative-working photosensitive resin composition which can be developed by an alkaline developer used in the pattern forming method of the present invention are a photosensitive resin composition comprising a quinone diazide photosensitizer and an alkali-soluble resin, a chemically amplified photosensitive resin composition. The chemically amplified photosensitive resin composition is preferred from the viewpoint of forming fine resist patterns with a high resolution.

Examples of the quinone diazide compound, which can be used in a positive-working photosensitive resin composition comprising a quinone diazide photosensitizer and an alkali-soluble resin, include 1,2-benzoquinonediazide-4-sulfonic acid, 1,2-naphthoquinonediazide-4-sulfonic acid, 1,2-naphthoquinonediazide-5-sulfonic acid, and esters or amides of these sulfonic acids. Examples of the alkali-soluble resin described above include a novolak resin, polyvinylphenol, polyvinylalcohol, and a copolymer of acrylic acid or methacrylic acid. As preferred examples of novolak resins are phenols such as phenol, o-cresol, m-cresol, p-cresol, xylenol, and aldehydes such as formaldehyde, paraformaldehyde.

Known chemically amplified photosensitive resin compositions can be used as the chemically amplified photosensitive resin composition. As the known chemically amplified photosensitive resin composition, there are exemplified a positive-working type chemically amplified photosensitive resin composition comprising a compound which generates an acid by irradiation of actinic light or radiation (photo-acid generator) and a resin, the polarity of which is increased by the action of an acid generated from the photo-acid generator and as a result, solubility for developer of which changes in an exposed area and a non-exposed area; or a negative-working type chemically amplified photosensitive resin composition comprising an alkali soluble resin, a photo-acid generator, and a crosslinking agent, wherein crosslinking of the resin by the crosslinking agent is caused by an action of an acid generated from the photo-acid generator and as a result, solubility for developer changes in an exposed area and a non-exposed area. For example, a chemical amplify PHS acrylate hydrate hybrid EUV resist is preferable, EIDEC Standard Resist 1 (EUVL Infrastructure Development Center, Inc.) is further preferable.

Further, acid-degradable dissolution inhibiting compounds, dyes, plasticizers, surfactants, photosensitizers, organic basic compounds, and compounds accelerating solubility in developer can optionally be used in the chemically amplified photosensitive resin composition.

The photosensitive resin composition is applied onto a substrate such as a silicon wafer or a glass plate, on which an anti-reflection film is provided if necessary, by using an appropriate coating apparatus such as a spinner and an appropriate coating method. The photosensitive resin composition applied is then prebaked, for example, on a hot plate and as a result, solvent in the photosensitive resin composition is removed to form a photoresist film. The temperature of prebaking can be 70~150 degree, preferably 90~150 degree for 10~180 seconds, preferably 30~90 seconds when on a hot plate or for 1~30 minutes when in a clean oven. Such condition can be modified depending on the apparatus and the resist composition contents (resin, solvent) being employed. The prebaked photoresist film is exposed using known exposure techniques such as a high pressure mercury lamp, a metal halide lamp, an ultra high pressure mercury lamp, a KrF excimer laser, an ArF excimer laser, a EUV irradiation device, a soft X-rays irradiation device, an electron drawing equipment etc. through a predetermined mask as needed. After the post-exposure bake (PEB), it is developed with a developer. Once developed the exposed photosensitive resin composition layer has become the resist pattern.

As a developing method, any method is suitable, for example, a paddle developing method etc. As a developer, an alkaline developer is preferred example, exemplified as a water or aqueous solution of sodium hydroxide, tetramethylammonium hydroxide (TMH) and the like. After the development, the resist pattern formed can be rinsed (cleaned) with a rinse composition of the present invention as described hereafter.

A fine patterning composition can be used for fattening the resist patterns, it means trenchs between those pattern walls will be narrowed. One embodiment of this invention lithography composition is used as a fine patterning composition. A fine patterning composition coated on resist patterns can be mixing baked to make a insoluble layer between the fine patterning composition and resist patterns. The insoluble layer will remain in later cleaning process, but will be eliminated with resist patters in final elimination process.

In the resist patterns forming method of the present invention, a contact time of the rinse composition with a resist pattern (a processing time) is preferably one or less than one second. Those skilled in the art would understand that the processing temperature can be selected based on the conditions being employed. Further, any suitable method of contacting the rinse composition with a resist pattern can be used. A method of immersing a resist substrate in a rinse composition and a method of dripping a rinse composition onto a spinning resist substrate are examples.

In the present resist patterns forming method, a cleaning treatment can be conducted before treatment with the present rinse composition and/or after treatment with the present rinse composition. The former cleaning treatment is conducted for cleaning a developer which is attached to resist patterns and the latter cleaning treatment is conducted for cleaning the rinse composition used. The method of rinse treatment with a present invention rinse composition can be any known method. For example, it can be conducted by immersing a resist substrate in a rinse composition or dripping a rinse composition onto a spinning resist substrate. These methods can be used individually or in combination. In one embodiment, the cleaning treatment can be performed with pure water.

In another embodiment, the cleaning treatment can be performed with another rinse composition, different from pure water and the present invention rinse composition, and can be used before or after the present rinse composition treatment. Conducting the final rinsing step with the present rinse composition is preferred.

For drying rinse composition, spin-drying, evaporation under reduced pressure, air drying, heating substrate, and combination thereof can be used. Spin-drying the present invention rinse composition is preferable.

The present invention resist patterns forming method has less problems of a patterns collapse margin, defects, and LWR, and in particular, patterns collapse and melting in fine resist patterns with a high aspect ratio can be improved effectively. Here, the aspect ratio is defined as a ratio of height of the resist pattern to width of the resist pattern. The present invention resist patterns forming method preferably includes a lithography step in which fine resist patterns are formed, that is, a lithography step containing an exposure in which an exposure wavelength of 250 nm or less by a KrF excimer laser, an ArF excimer laser, an EUV, X-rays, electron beams or the like is used as an exposure light. In forming of ultra fine patterns by exposing a chemically amplified photosensitive resin composition with an extreme ultra violet ray (EUV, preferably 10~20 nm wavelength, more preferably 12~14 nm wavelength), a lithography using a present invention rinse composition can be used preferably from the point of view of prevention of pattern melting, prevention of patterns collapse, improvement of collapse limit critical dimension, and the like.

The resist patterns formed by of the present invention method can be used for a resist for etching, plating, ion diffusion treatment, and dyeing processing, for example. The resist film is peeled off as needed after processing.

<A Method to Manufacture Semiconductor Devices>

The above disclosed method for forming the resist patterns can be used in the present invention semiconductor manufacturing method. The resist patterns cleaned and formed by the present invention can be used as an etching mask for patterning of the substrate or one or more other layers on the substrate. Further known processing and circuit formation can be done to make a semiconductor device.

<Stress on the Resist Wall During Drying Rinse Composition>

As described in Namatsu et al. Appl. Phys. Lett. 1995 (66) p 2655-2657, and depicted schematically in FIG. 1, stress to resist wall during rinse drying can be described by the below formula.

$$\sigma_{max} = (6\gamma \cos \theta / D) \times (H/W)^2$$

$\sigma_{max}$: Maximum stress to resist, $\gamma$: Surface tension of rinse
θ: contact angle, D: Distance between walls
H: Height of the wall, W: Width of the wall Those length can be measured by known method, for example SEM photo.

As can be seen from the above formula, a short D or a short W causes more stress. In this specification, "pitch size" means one unit of sequence resist pattern units of a W and a D, as described in FIG. 1. It means that the finer the resist patterns (the narrower pitched size) that are required, the more stress the resist patterns have. For such a strict condition, more improvement for the rinse composition are required.

In an integrated circuit, patterns on the circuit take complicated walls and trench structures. The finest pitch size resist pattern will have the most demanding and challenging condition.

For efficient manufacturing by the present rinse composition, the finest pitch size of a resist pattern of resist patterns on one whole circuit unit can be 20 nm or less. The "one whole circuit unit" is made to one semiconductor device in later processes. The term of "the finest pitch size" means the shortest length between two parallel resist walls on one whole circuit unit.

The present invention provides an improved lithography composition for pattern collapse prevention than known rinse compositions described on Patent publication JP2014-219577A and JP2014-44298A. The finest pitch size of a resist pattern on one whole circuit unit using the rinse composition of the present invention is preferably 10-20 nm, more preferably 12~19 nm, further preferably 14~18 nm.

Reference will now be made to more specific embodiments of the present disclosure and experimental results that provide support for such embodiments. However, Applicants note that the disclosure below is for illustrative purposes only and is not intended to limit the scope of the claimed subject matter in any way.

Synthesis Example 1

Following synthesis were done to obtain a novel compound represented by above formula (I)' by the following synthesis scheme.

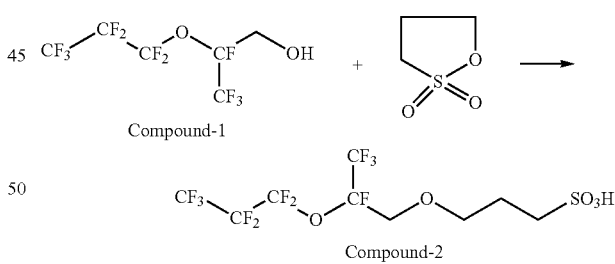

Potassium tert-Butoxide (Tokyo Kasei Kogyo Co Ltd.) 7.4 g was dissolved in tert-butyl alcohol (Tokyo Kasei Kogyo Co Ltd.) 100 g at room temperature in flask. Above Compound-1 (Unimatec Co Ltd.) 6.5 g was added in flask by dropping funnel and it was stirred for 2 hour. After that, 1,3-Propanesultone (Tokyo Kasei Kogyo Co Ltd.) 8.1 g in tert-butyl alcohol 10 g solution was added. And the solution was stirred at 65 degree for 6 hours. The solution was evaporated to remove the solvent. The rest material was dissolved in pure water 100 g. 36% HCl 40 g and Novec™7300 (by 3M) 50 g were added to the water solution. The Novec layer was taken and evaporated. And the above compound-2 was yielded (45%).

Known precursors and/or method can be combined above described synthesis example to obtain compound(s) that fall within formula (I)'. Those precursors can be obtained by for example Unimatec Co. Ltd., or fluorochem.

Synthesis Example 2

Following synthesis were done to obtain a novel compound represented by above formula (I)' by the following synthesis scheme

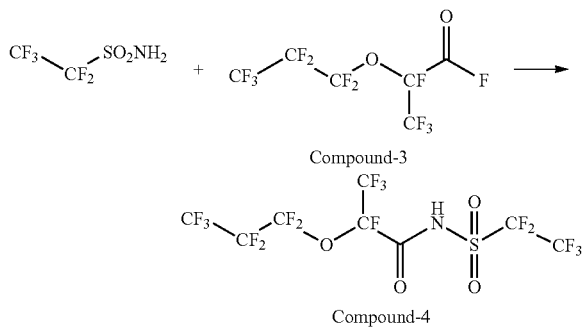

Compound-3

Compound-4

48% Potassium hydroxide water solution (Tokyo Kasei Kogyo Co Ltd.) 200 g and Perfluoroethanesulfonamide (Penta ethane sulfone amide, Tokyo Kasei Kogyo Co Ltd.) 150 g were mixed in flask. The salt solution was evaporated to remove water. The rest material 50 g and Compound-3 (Unimatec Co Ltd.) 65 g was dissolved in Acetonitrile 200 g and stirred at 50 degree for 20 hours. The solution was filtrated and evaporated to remove Acetonitrile. The rest material was dissolved in water 200 g. 36% HCl 100 g and Novec™7300 (by 3M) 100 g were added to the water solution. The Novec layer was taken and evaporated. The compound-4 was obtained in a yield of 20%.

Known precursors and/or method can be combined above described synthesis example to obtain compound(s) fall within formula (I)'. Those precursors can be obtained by for example Unimatec Co. Ltd., or fluorochem.

Example 1

For a pattern collapse prevention performance evaluation, below procedures were done.
A Silicon wafer (SUMCO, 12 inch) surface was treated by a 1,1,1,3,3,3-Hexamethyldisilazane (HMDS) at 90 degree for 60 seconds. Chemical amplify PHS acrylate hydrate hybrid EUV resist was spin-coated on the silicon wafer, and soft-baked at 110 degree for 60 seconds to form a resist film in 50 nm thickness. The resist film on the wafer was exposed to light with varying the exposure dose through 20 nm size (line:space=1:1) mask in the EUV exposure apparatus (High NA Small Field Exposure Tool, NA=0.51, quadrupole). The wafer was post exposure baked (PEB) 110 degree for 60 seconds. And the resist film was paddle-developed with 2.38% Tetramethylammonium Hydroxide (TMAH) aqueous solution for 30 seconds. Rinse water was poured into a puddle of the developer on the wafer, pouring thereof was continued while rotating the wafer to replace the developer with the rinse water, and the rotation of the wafer was stopped in a puddled state by water. Subsequently a lithography composition as a lithography composition was introduced into the puddle of water, which is 250 ppm F1 surfactant (Unimatec Co. Ltd.) described below and 500 ppm A1 diol derivative described below in water (deionized water) and the wafer was rotated at high speed to dry it.

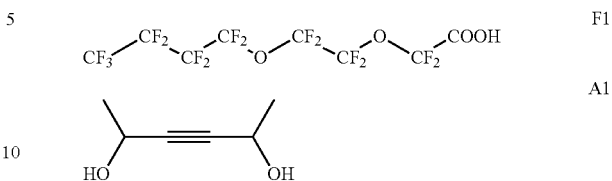

0.5 μm×0.5 μm SEM photo of the resist patterns was taken. The pitch sizes of the resist patterns were approximately 20 nm.

Pattern collapse prevention performance was evaluated with CG4000 (Hitachi High-Technologies Corp.). The evaluation criteria are described as below.
A: Pattern collapse was not observed.
B: Pattern collapse(s) was observed.

For a defects evaluation, below procedures were done.
Chemical amplify PHS acrylate hydrate hybrid EUV resist was spin-coated on the silicon wafer (SUMCO, 12 inch), and soft-baked at 110 degree for 60 seconds to form a resist film in 50 nm thickness. The resist film was paddle-developed with 2.38% Tetramethylammonium Hydroxide (TMAH) aqueous solution for 30 seconds. Rinse water was poured into a puddle of the developer on the wafer, pouring thereof was continued while rotating the wafer to replace the developer with the rinse water, and the rotation of the wafer was stopped in a puddled state by water. Subsequently the above lithography composition (250 ppm F1 surfactant and 500 ppm A1 in water) was introduced and the wafer was rotated at high speed to dry it.

Defects of the resist patterns are evaluated with a wafer surface Inspection equipment $L_{59110}$ (Hitachi High-Technologies Corp.). The evaluation criteria are described as below.
A: Defects number were 50% or less than the number of the resist patterns produced by same to above procedures except that the rinsing step with the lithography composition was not done.
B: Defects number were more than 50% to the number of the resist patterns produced by same to above procedures except that the rinsing step with the lithography composition was not done.

Example 2 to 26. Comparative Example 1 to 6

Same procedures were done to the above example 1 for preparing resist patterns on the silicon wafer, except that the lithography composition of the example 1 were changed as described below in table 1. Same evaluations were done. The results are described below in table 1.

TABLE 1

|  | Surfactant (amount, ppm) | Diol derivative (amount, ppm) | Pattern collapse | Defects |
| --- | --- | --- | --- | --- |
| Example 1 | F1 (250) | A1 (500) | A | A |
| Example 2 | F2 (250) | A1 (500) | A | A |
| Example 3 | F3 (250) | A1 (500) | A | A |
| Example 4 | F4 (250) | A1 (500) | A | A |
| Example 5 | F5 (250) | A1 (500) | A | A |
| Example 6 | F6 (250) | A1 (500) | A | A |
| Example 7 | F7 (250) | A1 (500) | A | A |
| Example 8 | F8 (250) | A1 (500) | A | A |

TABLE 1-continued

| | Surfactant (amount, ppm) | Diol derivative (amount, ppm) | Pattern collapse | Defects |
|---|---|---|---|---|
| Example 9 | F9 (250) | A1 (500) | A | A |
| Example 10 | F10 (250) | A1 (500) | A | A |
| Example 11 | F1 (250) | A2 (500) | A | A |
| Example 12 | F2 (250) | A3 (500) | A | A |
| Example 13 | F1 (250) | A1 (500) | A | A |
| Example 14 | F1 (250) | A4 (500) | A | A |
| Example 15 | F1 (250) | A5 (500) | A | A |
| Example 16 | F1 (250) | A7 (500) | A | A |
| Example 17 | F1 (250) | A8 (500) | A | A |
| Example 18 | F1 (250) | A9 (500) | A | A |
| Example 19 | F1 (250) | A1 (500) | A | A |
| Example 20 | F1 (150) | A7 (500) | A | A |
| Example 21 | F1 (500) | A7 (500) | A | A |
| Example 22 | F1 (1000) | A7 (500) | A | A |
| Example 23 | F1 (250) | A1 (250) | A | A |
| Example 24 | F1 (250) | A1 (1000) | A | A |
| Example 25 | F1 (250) | A1 (2000) | A | A |
| Example 26 | F11 (500) | A1 (500) | A | A |
| Comp. ex. 1 | F1 (250) | — | A | B |
| Comp. ex. 2 | — | A1 (500) | B | A |
| Comp. ex. 3 | F1 (500) | A10 (500) | B | B |
| Comp. ex. 4 | F1 (500) | A11 (500) | B | B |
| Comp. ex. 5 | F1 (500) | A12 (500) | B | B |
| Comp. ex. 6 | F12 (500) | A1 (500) | B | A |

"Comp. ex." in above table means "Comparative example".

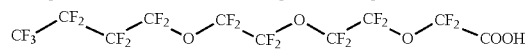

F2

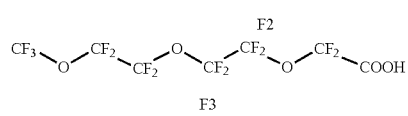

F3

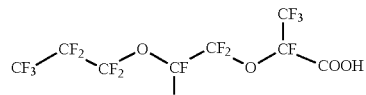

F4

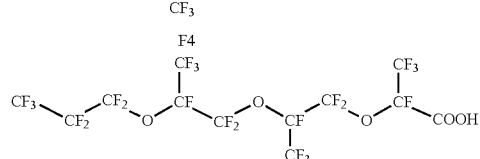

F5

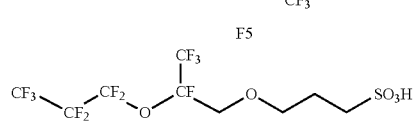

F6

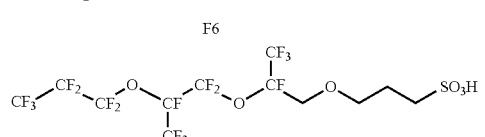

F7

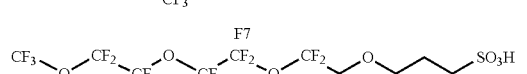

F8

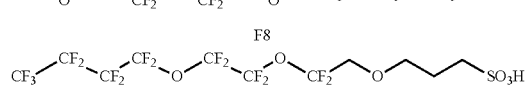

F9

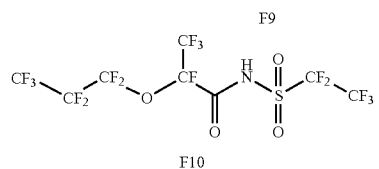

F10

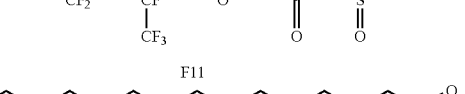

F11

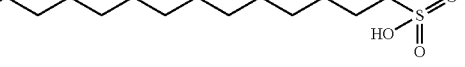

(Comparative) F12

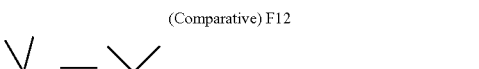

A2

A3

A4

A5

A6

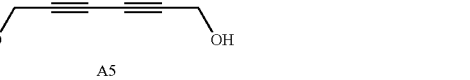

A7

A8

A9

(Comparative) A10

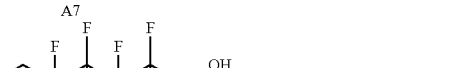

(Comparative) A11

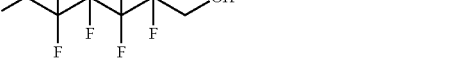

(Comparative) A12

Example 27

Various pitch sized resist patterns were prepared as described below. Same procedures were done to the above pattern collapse prevention performance evaluation of the example 1 for preparing resist patterns on the silicon wafers, except that exposure mask sizes was varied from 24 nm to 15 nm (each line:space ratio are 1:1). [0014]

Approximately 24, 23, 22, 21, 20, 19, 18, 17, 16 and 15 nm pitch sizes resist patterns were obtained on each silicon wafers. 0.5 μm×0.5 μm SEM photo of the resist patterns were taken.

Because the more stress during drying lithography composition applies to the resist pattern walls as narrower pitch size, the pattern collapse evaluation by CG4000 (Hitachi High-Technologies Corp.) was done from wider pitch size resist patterns to narrower one in order. When one pattern collapse was observed in one width pitched resist patterns, the narrower pitched size resist patterns were not evaluated because it had more severe condition.

In the example 26, pattern collapse was observed at the 18 nm pitched size resist patterns, and 17 to 15 pitched sizes resist patterns were not evaluated.

Example 28. Comparative Example 7 to 10

Same procedures were done to the above example 26 for preparing resist patterns on the silicon wafer, except that the lithography composition of the example 26 were changed as described below in table 2. Same evaluations to example 26 were done. The results are described on below table 2. In the comparative example 9, Surfynol® 440 (Nissin Chemical Industry Co., Ltd.) was used as a surfactant. In the comparative example 10, Surfynol® 2502 (Nissin Chemical Industry Co., Ltd.) was used as a surfactant, and the patterns were melted by the lithography composition as a rinse treatment. Surfynol® 440 and Surfynol® 2502 don't have fluorine or Y in surfactant formula (I) of our invention.

TABLE 2

| | Surfactant (amount, ppm) | Diol derivative (amount, ppm) | Width (nm) pattern collapse observed |
|---|---|---|---|
| Example27 | F1 (250) | A1 (500) | 18 |
| Example28 | F1 (250) | A1 (500) | 16 |
| Comp. ex. 7 | F1 (250) | — | 20 |
| Comp. ex. 8 | — | A1 (500) | 22 |
| Comp. ex. 9 | Surfinol 440 (500) | A1 (500) | 22 |
| Comp. ex. 10 | Surfinol 2502 (500) | A1 (500) | Pattern melted |

"Comp. ex." in above table means "Comparative example".

In the finer resist patterns, the present invention lithography composition exhibited better performances for example pattern collapse preventing property.

The invention claimed is:

1. A lithography method for forming resist patterns comprising applying a rinse composition comprising a lithography material, water and a surfactant represented by the formula (I) below,
which is selected from the group consisting of:

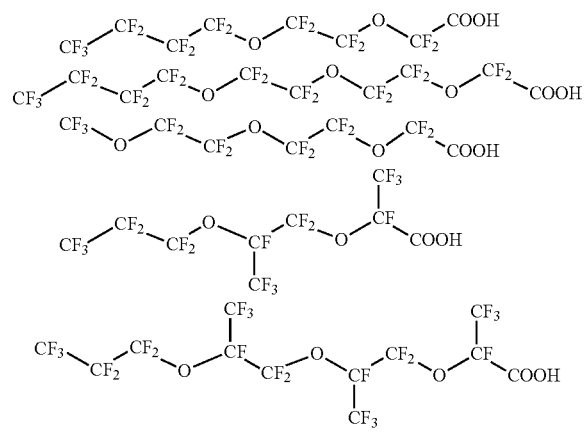

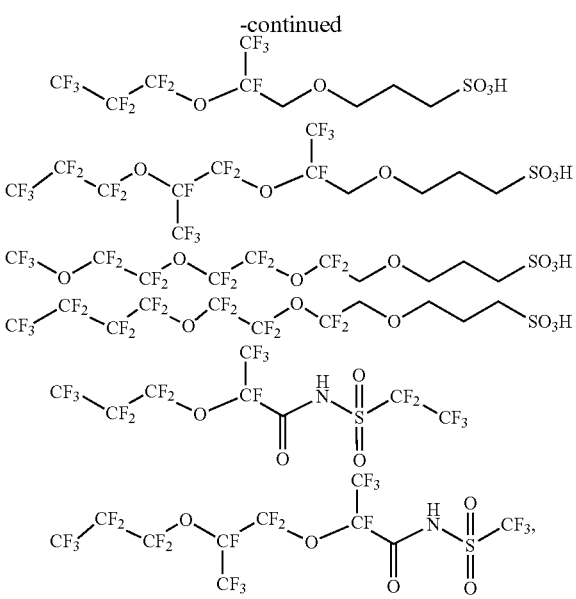

and a mixture thereof
to a substrate,
wherein the method comprises
(1) applying a photosensitive resin composition on a substrate, with or without one or more intervening layers, to make a photosensitive resin composition layer,
(2) exposing the photosensitive resin composition layer to radiation,
(3) developing the exposed photosensitive resin composition layer to form a developed layer with resist patterns, and
(4) rinsing the developed layer with the rinse composition and wherein the lithography material is selected from the group consisting of 3-Hexyn-2,5-diol, 2,5-Dimethyl-3-hexyne-2,5-diol, 3,6-Dimethyl-4-octyne-3,6-diol, 1,4-Butynediol, 2,4-Hexadiyne-1,6-diol, 1,4-Butanediol, 2,2,3,3-Tetrafluoro-1,4-butanediol, 2,2,3,3,4,4,5,5-Octafluoro-1,6-hexanediol, cis-1,4-Dihydroxy-2-butene, and any mixture of any of these.

2. The lithography method for forming resist patterns according to claim 1, wherein the photosensitive resin composition is a chemically amplified photosensitive resin composition and the exposure is an exposure with extreme ultra violet radiation.

3. The lithography method for forming resist patterns according to claim 1, wherein the finest pitch size of the resist pattern on one whole circuit unit is on or more than 10 nm to on or less than 20 nm.

4. A semiconductor device manufacturing method comprising the lithography method for forming resist patterns according to claim 1.

5. The semiconductor device manufacturing method according to claim 4, further comprising;
making gaps in the substrate by using the formed resist patterns as a mask.

6. The lithography method for forming resist patterns according to claim 1, wherein the content ratio of the surfactant represented by formula (I) is on or more than 0.005 and on or less than 0.5 mass % in the rinse composition.

7. The lithography method for forming resist patterns according to claim 1, wherein the content ratio of the lithography material is on or more than 0.01 and on or less than 0.5 mass % in the rinse composition.

8. The lithography method for forming resist patterns according to claim 1, wherein the rinse composition further comprises at least one additional component selected from acids, bases, surfactants other than the surfactant represented by formula (I) and an organic solvent other than 3-Hexyn-2,5-diol, 2,5-Dimethyl-3-hexyne-2,5-diol, 3,6-Dimethyl-4-octyne-3,6-diol, 1,4-Butynediol, 2,4-Hexadiyne-1,6-diol, 1,4-Butanediol, 2,2,3,3-Tetrafluoro-1,4-butanediol, 2,2,3,3,4,4,5,4-Octafluoro-1,6-hexanediol, cis-1,4-Dihydroxy-2-butene, and any mixture of any of these.

9. The lithography method for forming resist patterns according to claim 1, wherein the rinse composition further comprises at least one additional component selected from fungicides, antimicrobial agents, preservatives and antifungal agents.

10. The lithography method for forming resist patterns according to claim 1, wherein the water is present in the rinse composition from 80 to 99.98 mass %.

11. The lithography method for forming resist patterns according to claim 1, wherein the water is present in the rinse composition from 95 to 99.98 mass %.

\* \* \* \* \*